United States Patent
Teitel et al.

(10) Patent No.: US 9,553,611 B2
(45) Date of Patent: Jan. 24, 2017

(54) ERROR CORRECTION CODING WITH HIGH-DEGREE OVERLAP AMONG COMPONENT CODES

(71) Applicant: APPLE INC., Cupertino, CA (US)

(72) Inventors: Moti Teitel, Herzlia Pituach (IL); Tomer Ish-Shalom, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 43 days.

(21) Appl. No.: 14/555,608

(22) Filed: Nov. 27, 2014

(65) Prior Publication Data

US 2016/0154697 A1 Jun. 2, 2016

(51) Int. Cl.
H03M 13/29 (2006.01)
H03M 13/00 (2006.01)
H03M 13/11 (2006.01)
G06F 11/10 (2006.01)

(52) U.S. Cl.
CPC ...... H03M 13/2918 (2013.01); G06F 11/1076 (2013.01); H03M 13/1148 (2013.01); H03M 13/2963 (2013.01); H03M 13/616 (2013.01)

(58) Field of Classification Search
CPC .............. H03M 13/2918; H03M 13/1148; H03M 13/616
See application file for complete search history.

(56) References Cited

U.S. PATENT DOCUMENTS

| | | | | |
|---|---|---|---|---|
| 4,627,058 A * | 12/1986 | Moriyama | ............ | H03M 13/29 714/758 |
| 4,653,051 A * | 3/1987 | Sugimura | ............. | H03M 13/29 714/755 |
| 4,654,853 A * | 3/1987 | Moriyama | ............ | H03M 13/29 714/774 |
| 4,665,537 A * | 5/1987 | Moriyama | ........ | H03M 13/1515 714/755 |
| 4,670,881 A * | 6/1987 | Imoto | ................ | G11B 20/1809 386/272 |
| 4,696,007 A * | 9/1987 | Moriyama | ............ | H03M 13/29 714/752 |
| 5,224,106 A * | 6/1993 | Weng | ..................... | H03M 13/29 714/755 |
| 5,371,745 A * | 12/1994 | Kiyonaga | .......... | G11B 20/1809 714/758 |
| 5,371,750 A * | 12/1994 | Inoue | ..................... | H03M 13/15 714/755 |
| 5,392,299 A * | 2/1995 | Rhines | ............... | G11B 20/1866 714/755 |
| 5,712,861 A * | 1/1998 | Inoue | .................. | H03M 13/151 714/752 |

(Continued)

OTHER PUBLICATIONS

Pyndiah, R.M..,"Near-Optimum Decoding of Product Codes: Block Turbo Codes", IEEE Transactions on Communications, vol. 46, No. 8, pp. 1003-1010, Aug. 1998.

*Primary Examiner* — Joseph D Torres
(74) *Attorney, Agent, or Firm* — D. Kligler IP Services Ltd.

(57) ABSTRACT

A method for Error Correction Code (ECC) encoding includes receiving data to be encoded. The data is encoded to produce a composite code word that includes multiple component code words. Each component code word in at least a subset of the component code words is encoded in accordance with a respective component code and has at least one respective bit in common with each of the other component code words.

20 Claims, 5 Drawing Sheets

(56) References Cited

U.S. PATENT DOCUMENTS

| | | | | |
|---|---|---|---|---|
| 5,745,505 A * | 4/1998 | Yonemitsu | G11B 20/1251 | 375/E7.025 |
| 5,920,578 A * | 7/1999 | Zook | H03M 13/1515 | 714/755 |
| 5,986,593 A * | 11/1999 | Kawahara | G11B 20/1833 | 341/94 |
| 6,023,783 A * | 2/2000 | Divsalar | H03M 13/256 | 375/262 |
| 6,029,264 A * | 2/2000 | Kobayashi | H03M 13/29 | 714/755 |
| 6,157,642 A * | 12/2000 | Sturza | H04B 7/18521 | 370/316 |
| 6,272,659 B1 * | 8/2001 | Zook | H03M 13/1515 | 714/763 |
| 6,298,461 B1 * | 10/2001 | Tong | H03M 13/2966 | 714/755 |
| 6,311,304 B1 * | 10/2001 | Kwon | H03M 13/15 | 714/701 |
| 6,367,047 B1 * | 4/2002 | McAuliffe | G11B 20/1833 | 714/755 |
| 6,757,862 B1 * | 6/2004 | Marianetti, II | H03M 13/05 | 714/759 |
| 7,089,477 B1 * | 8/2006 | Divsalar | H03M 13/1111 | 714/755 |
| 7,127,658 B2 * | 10/2006 | Cucchi | H03M 13/271 | 714/755 |
| 7,356,752 B2 * | 4/2008 | Hewitt | H03M 13/2903 | 714/755 |
| 7,516,389 B2 * | 4/2009 | Song | H03M 13/2972 | 360/53 |
| 7,546,509 B2 * | 6/2009 | Kim | H03M 13/033 | 714/755 |
| 7,562,021 B2 * | 7/2009 | Mehrotra | G10L 19/038 | 375/246 |
| 7,702,986 B2 * | 4/2010 | Bjerke | H03M 13/11 | 341/143 |
| 8,176,381 B2 | 5/2012 | Djordjevic et al. | | |
| 8,255,763 B1 | 8/2012 | Yang et al. | | |
| 8,321,746 B2 * | 11/2012 | Li | H03M 13/033 | 714/752 |
| 8,656,246 B2 * | 2/2014 | Sindhushayana | H04L 1/0045 | 714/755 |
| 9,196,299 B2 * | 11/2015 | Wilson | G06F 11/1076 | |
| 2001/0048694 A1 * | 12/2001 | Banister | H04L 1/0025 | 370/537 |
| 2001/0050622 A1 * | 12/2001 | Hewitt | H03M 13/2903 | 341/50 |
| 2002/0034269 A1 * | 3/2002 | Demjanenko | H03M 13/2707 | 375/341 |
| 2005/0058089 A1 * | 3/2005 | Vijayan | H04B 7/12 | 370/312 |
| 2006/0026492 A1 * | 2/2006 | Rhee | H03M 13/2782 | 714/784 |
| 2009/0207725 A1 * | 8/2009 | Zhang | H04L 1/0026 | 370/203 |
| 2010/0011275 A1 * | 1/2010 | Yang | G11B 20/1803 | 714/755 |

\* cited by examiner

ERROR CORRECTION CODING WITH HIGH-DEGREE OVERLAP AMONG COMPONENT CODES

TECHNICAL FIELD

Embodiments described herein relate generally to Error Correction Coding (ECC), and particularly to methods and systems for ECC encoding.

BACKGROUND

Various types of Error Correction Codes (ECC) comprise multiple component code words that are derived in accordance with respective component codes. For example, some types of Turbo Block Codes (TBC) comprise a matrix, in which the rows and columns comprise the component code words. As another example, encoding a Turbo Product Code (TPC) typically comprises applying a cascade of two or more component encoders.

U.S. Pat. No. 8,255,763, whose disclosure is incorporated herein by reference, describes an error correction system, which includes an iterative code that employs an interleaved component code and an embedded parity component code. On the transmission side, input signals received at an input node are encoded based on the interleaved code, which encodes an interleaved version of the input data to produce a first set of code words. A portion of the first set of code words is divided into a plurality of symbols which are encoded based on the embedded parity code.

U.S. Pat. No. 8,176,381, whose disclosure is incorporated herein by reference, describes a transmitter, a receiver and corresponding methods. The transmitter includes encoders configured to encode source bit streams from L information sources into bytes of code words. Each encoder includes different (n, k) multidimensional turbo-product codes of code rate R=k/n, where k is a number of information bytes, and n is code word length. The encoders operate in at least two phases. A first phase involves operating $k_y$ column-encoders in parallel on $k_x$ bytes per column to generate the code words for a current dimension. A second phase involves operating $n_x$ row-encoders in parallel on $k_y$ memory locations per rows to generate the code words for the current dimension. The first and second phases are repeated for remaining layers of the current dimension and layers of other dimensions.

SUMMARY

An embodiment that is described herein provides a method for Error Correction Code (ECC) encoding, including receiving data to be encoded. The data is encoded to produce a composite code word that includes multiple component code words. Each component code word in at least a subset of the component code words is encoded in accordance with a respective component code and has at least one respective bit in common with each of the other component code words.

In some embodiments, encoding the data includes individually encoding each of the component code words in a first subset of the component code words and jointly encoding the component code words in a second subset of the component code words, which includes the component code words not belonging to the first subset. In other embodiments, individually encoding each of the component code words in the first subset includes encoding one or more of the component code words of the first subset based on respective one or more bits that are in common with other component code words of the first subset. In yet other embodiments, jointly encoding the second subset of the component code words includes multiplying a vector that includes at least part of the component code words of the first subset by a predefined matrix.

In an embodiment, the predefined matrix depends on a sub-matrix of a parity check matrix of the composite code, and the sub-matrix serves for checking the component code words of the second subset. In another embodiment, encoding the data includes combining the component code words, so that each bit that is common to one or more component code words appears only once in the composite code word. In yet another embodiment, encoding the data includes encoding the component code words so that each of the component code words includes multiple bit groups, each shared by one or more component code words.

In some embodiments, each of the bit groups includes a number of bits that depends on the number of component codes and on the number of component code words that share each bit group. In other embodiments, encoding the data includes, for a given bit group of the composite code word that is shared among multiple component code words, applying different bit-ordering permutations to the bit group in one or more of the component code words. In yet other embodiments, applying the bit-ordering permutations includes reversing a bit-order of the bit group in one or more of the component code words.

There is additionally provided, in accordance with an embodiment of the present invention, an ECC encoder including an interface and encoding circuitry. The interface is configured to receive data to be encoded. The encoding circuitry is configured to encode the data to produce a composite code word that includes multiple component code words, each component code word in at least a subset of the component code words is encoded in accordance with a respective component code and has at least one respective bit in common with each of the other component code words.

These and other embodiment will be more fully understood from the following detailed description of the embodiments thereof, taken together with the drawings in which:

DETAILED DESCRIPTION OF EMBODIMENTS

Overview

Figure 1:
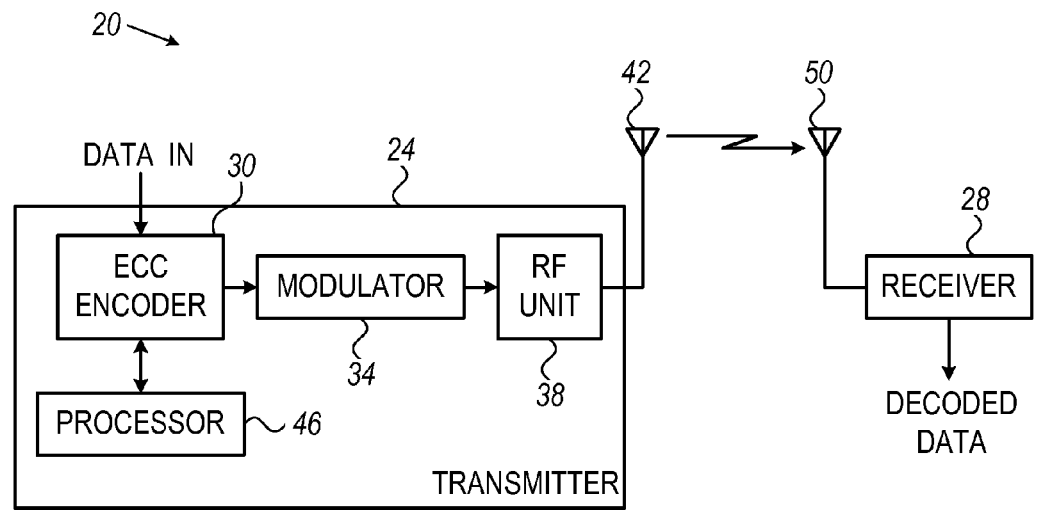
FIG. 1 is a block diagram that schematically illustrates a wireless communication system that uses error correction coding, in accordance with an embodiment that is described herein.

Various types of Error Correction Codes (ECC) comprise multiple underlying component codes. The component codes may comprise any suitable linear block codes, such as, for example, BCH codes. An ECC that comprises multiple underlying component codes is referred to herein as a "composite code." Encoders suitable for encoding the composite and component codes are referred to herein as a "composite encoder," and "component encoder," respectively. Similarly, the code words produced by the composite and component encoders are referred to herein as "composite code words" and "component code words," respectively.

It is possible in principle to define a composite code in which the component codes are arranged in a multi-dimensional array, e.g., rows and columns of a two-dimensional matrix. To make the design of such a composite code more flexible in terms of the achievable code rates, it is possible to construct the code so that each horizontal component code word shares groups of multiple bits with vertical component code words, rather than sharing a single bit. This design approach, however, may result in relatively large groups of shared bits, which may cause frequent trapping set events at the decoder, as will be described below.

A composite code may be decoded by iteratively decoding the individual component code words. If each component code word shares one or more bits with at least one other component code words, successful decoding of one component code word may assist in the decoding of other component code words in later iterations. Note, however, that sharing large groups of bits among the component code words increases the likelihood that the number of erroneous bits falling within a given group of shared bits will exceed the error correction capabilities of the component codes involved, which may cause a trapping set event.

Embodiments that are described herein provide improved methods and systems for composite code encoding. In some embodiments, a component encoder receives data to be encoded and encodes this data so that each component word in at least a subset of the component code words has at least one respective bit in common with each of the other component code words. Compared to a two-dimensional solution, in which each component code word has one or more bits in common with only half of the component code words, the disclosed schemes reduce the size of the group of shared bits (e.g., by about 50% for two-dimensional codes and by higher reduction factors for multi-dimensional codes) and therefore significantly reduce the rate of trapping set scenarios at the decoder. Higher reduction ratio can be achieved, depending on the scheme and design parameters of the composite code.

In some embodiments, the composite encoder produces a composite code word whose component code words each comprises multiple groups of bits, so that each of the groups of bits is shared with one or more other component code words. The number of bits in these groups of bits depends on the total number of component codes and on the number of component code words that share each group of bits.

In some embodiments, the composite encoder separates the component code words into first and second subsets, so that the component code words of the first subset are each encoded individually and the component code words of the second subset are encoded jointly. The input for the individual encoding of a given component code word possibly comprises bits that the given component code word shares with other component code words of the first subset. The joint encoding is based on processing the component code words that were encoded individually, and guarantees generating valid component code words in accordance with the underlying component codes.

In an embodiment, jointly encoding the component code words comprises multiplying a vector, comprising the data input to the composite encoder and the redundancy bits generated by the component codes that were applied individually, by a predefined matrix. In an embodiment, the predefined matrix is derived from a sub-matrix of a parity check matrix of the composite code. The sub-matrix is designed for checking the code words that are encoded jointly. Alternatively, the predefined matrix may comprise any other suitable matrix.

In some embodiments, the composite encoder combines the shared groups of bits of the encoded component code words, to produce the final composite code word, so that each group of shared bits appears only once in the composite code word. In some embodiments, the composite encoder accumulates the bits of composite code word progressively. For example, starting with the data bits (i.e., the entire input to the composite encoder), then progressively accumulating the parity bits generated by each component encoder, and finally adding the parity bits that are generated using joint encoding. Alternatively, any other suitable cumulative (or other) process to derive the composite code word can also be used. Note that in general different component codes may generate different numbers of redundancy bits.

In some embodiments, the composite encoder increases the minimal distance of the composite code by applying bit-ordering permutations to one or more of the groups of bits that are shared among multiple component code words. Thus, the composite encoder applies different permutations to a group of shared bits, in each of the respective component code words in which the group of bits is shared.

In an example embodiment, a G-bit group is shared among two component code words, and the composite encoder reverses the order of the bits in the G-bit group in only one of the respective component code words. Using the G-bit group and its reversed bit-order version is equivalent to encoding the original bit group using a generator polynomial $g(x)$ and the reversely ordered bit group using a generator polynomial $g(x^{-1})$, whose roots are the reciprocals of the roots of $g(x)$.

In an embodiment, the combined roots of $g(x)$ and $g(x^{-1})$ form a sequence of consecutive powers of $\alpha$ (a being a primitive element of $GF(2^m)$ over which the generator polynomials are defined) that is longer than (i.e., about double) the respective sequences of each of $g(x)$ and $g(x^{-1})$ alone, thus increasing the minimal distance significantly. In other embodiments, other generating polynomials whose roots do not form a sequence of consecutive powers of $\alpha$ can also be used for increasing the minimal distance.

In summary, in the disclosed techniques the composite encoder produces composite code words in which each component code word shares one or more groups of bits with all the other component code words. Such an encoding scheme results in sharing smaller groups of bits among the component code words compared to conventional composite encoding, and therefore results in reduced rate of trapping sets at the decoder.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC encoder 30 (the encoded data is also referred to as a code word), modulates the encoded data, using a modulator 34, in accordance with a certain modulation scheme, converts the modulated digital signal to an analog signal, up-converts the analog signal to a suitable Radio frequency (RF) using an RF unit 38 and transmits the RF signal toward the receiver using a transmitting antenna 42. A processor 46 is configured to control the operation of ECC encoder 30. The structure and functionality of encoder 30 will be described in detail below.

In receiver 28 (whose internal elements are not shown), a receiving antenna 50 receives the RF signal and provides it to a RF front end, which down-converts the RF signal to baseband or to a suitable Intermediate Frequency (IF), and digitizes the signal using a suitable Analog to Digital Converter (ADC). The digitized signal carrying the ECC-encoded data (i.e., the received code word possibly containing one or more errors) is demodulated by a modem, and the ECC is decoded by an ECC decoder. By decoding the ECC, the decoder at the receiver reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems or optical communication systems, as well.

Figure 2:
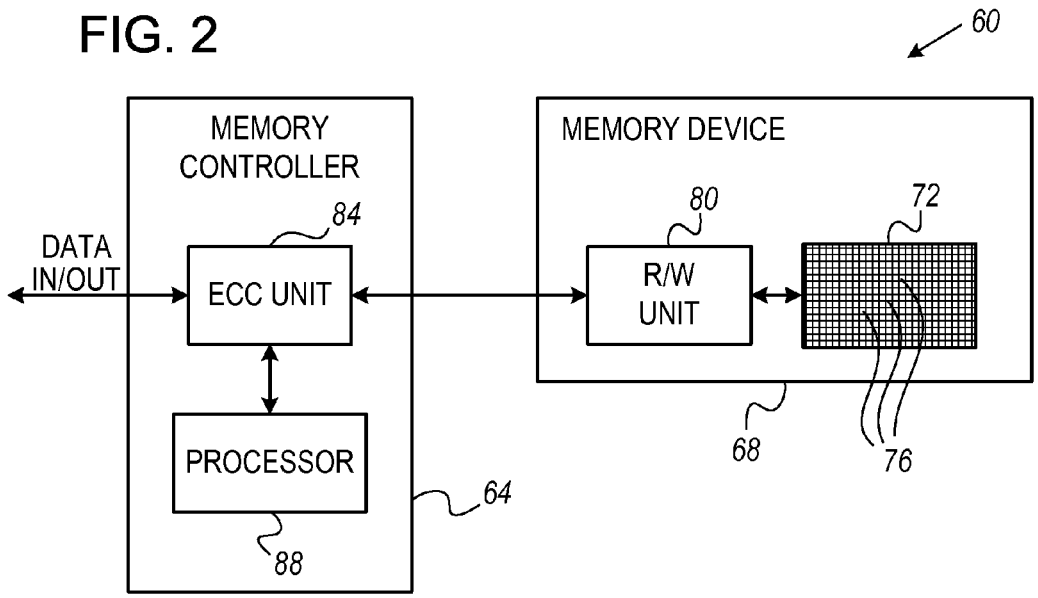
FIG. 2 is a block diagram that schematically illustrates a data storage system that uses error correction coding, in accordance with an alternative embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage in accordance with a certain ECC, and decodes the ECC of data that is retrieved from the memory cells. Unit 84 is controlled by a processor 88. The structure and functionality of the encoding part of unit 84 are described in detail below. The ECC used in systems 20 and 60 may comprise, for example, a Turbo Block Code (TBC), a Generalized Low Density Parity Check (GLDPC) code, as well as various other types of ECC.

The ECC encoding schemes described herein can be used in communication systems such as system 20, as well as in data storage systems such as system 60. The description that follows applies to both communication applications and to storage applications, and refers generally to an ECC encoder. Any reference to the ECC encoder applies to encoder 30 of system 20, as well as to the encoder functionality of unit 84 in system 60. Alternatively, the methods described herein can be carried out by any other suitable element in any other suitable system that involves ECC encoding.

Composite Error Correction Codes

The complexity of ECC encoding and decoding typically increases significantly with the code size. In some applications, such as in certain communication and storage systems, the ECC comprises multiple lower-complexity component codes. The component codes may comprise any suitable block codes, such as, for example, BCH codes. An ECC that comprises multiple underlying component codes is also referred to herein as a "composite code." An encoder that encodes data in accordance with a respective component code is referred to herein as a "component encoder," and an encoder that encodes data in accordance with the composite code is referred to herein as a "composite encoder." Similarly, the code words produced by the composite and component encoders are referred to herein as "composite code words" and "component code words," respectively.

One possible way of constructing a composite code is to define a matrix array whose rows and columns comprise respective horizontal and vertical component codes. Such codes in which each horizontal component code word shares a single bit with one vertical component code word may impose, at design time, restrictions on the achievable code rates, given the size of the composite code.

One way to relax such restrictions on the achievable code rates is to construct a TBC in which each horizontal component code word shares groups of multiple bits (as opposed to single bits) with vertical component code words. An example of designing such a TBC, which can also be viewed as a type of a Generalized Low Density Parity Check (GLDPC) code, is given below. This design approach, however, may result in relatively large groups of shared bits, which may cause frequent trapping or stopping set scenarios at the decoder.

Decoding a composite code typically comprises iteratively decoding the individual component code words. Schemes for iterative decoding are described, for example, by Pyndiah, in "Near-Optimum Decoding of Product Codes: Block Turbo Codes," IEEE Transactions on Communications, vol. 46, no. 8, August, 1998, pages 1003-1010, which is incorporated herein by reference.

A trapping or stopping set state may occur, for example, when the number of erroneous bits in a group of bits that is shared among two or more component code words exceeds the error correction capabilities of any of the individual component codes involved. Since the likelihood that a larger portion of the erroneous bits in an erroneous component code word falls among the shared group of bits increases with the size of the group, decoding composite code words whose component code words share larger groups of bits is likely to result in more frequent trapping set events.

Consider, for example, designing a TBC that encodes k=8 Kbytes or 65536 bits into n=67563 encoded bits i.e., the respective code rate is given by k/n=0.97. The total number of redundancy bits is therefore 67563−65536=2027 bits. Using a BCH(2400, 2364) code whose code rate approximately equals 0.985 as the underlying component code, results in a number of 2364−2400=36 redundancy bits per component code word, and therefore the required number of such BCH component codes equals 56 ([2027/36]=56).

The component code words of the TBC in the present example can be arranged as 56/2=28 horizontal code words of about 2400 bits each, and 56/2=28 vertical code words of about 2400 bits that are G=[2400/28]=86 bits wide. According to this TBC scheme, each vertical component code word shares 86 bits with 28 (i.e., with half of the total number of component code words) different horizontal component code words.

Note that in the general case of a two-dimensional TBC code, a given horizontal code word can share bits with vertical code words, but not with other horizontal code words. Similarly, a given vertical code word can share bits only with horizontal code words, and not with other vertical code words. As a result, the size of the shared group of bits should be at least as large as the size of the component code word divided by half the total number of component codes (i.e., 2400/28 in the example above).

In the disclosed techniques, the component code is designed so that each component code word shares a respective group of bits with each of the other component code words. Such novel encoding schemes reduce the size of the group of shared bits significantly, and therefore also reduce the probability for trapping set events at the decoder.

Encoding Composite Codes with High-Degree Overlap Among Component Codes

Figure 3:
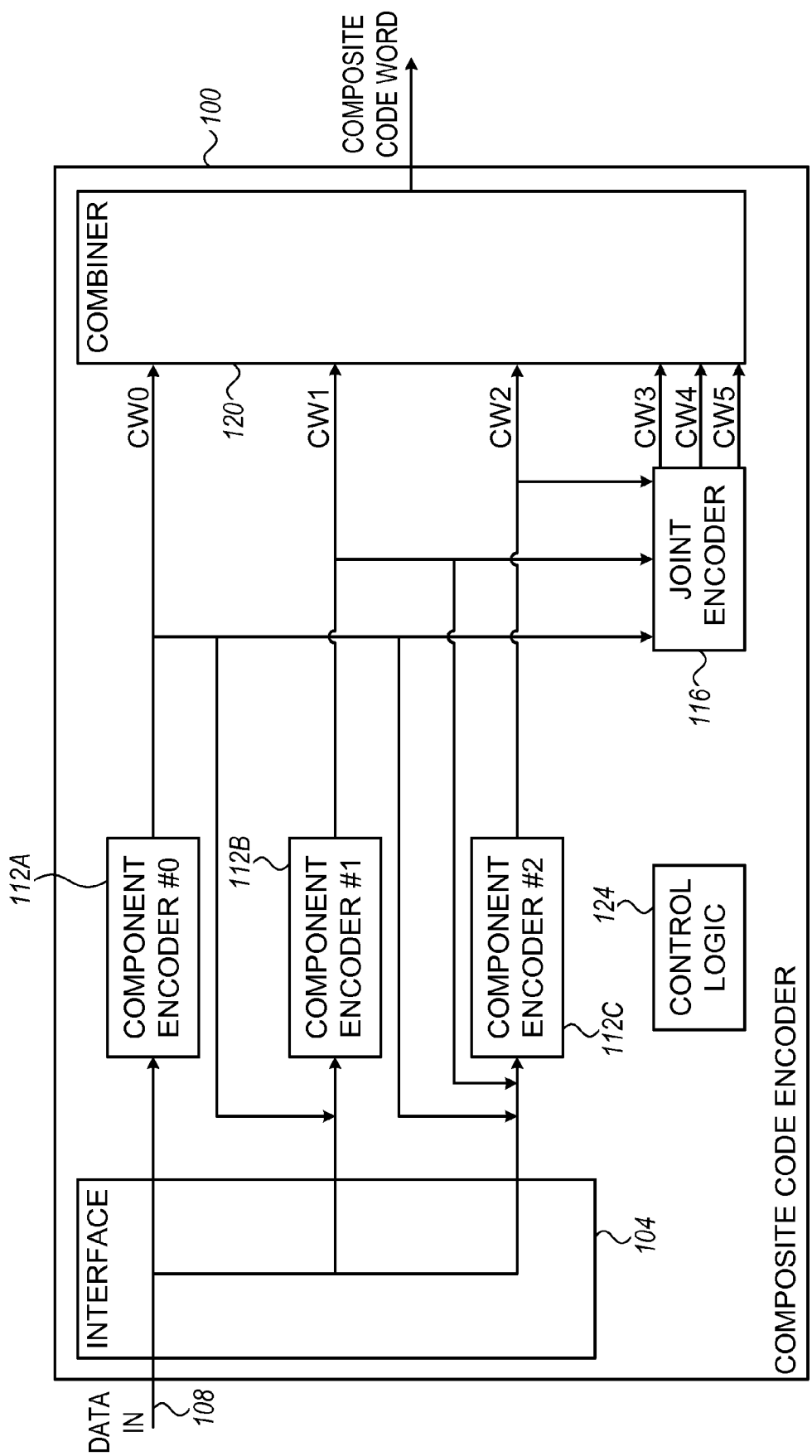
FIG. 3 is a block diagram that schematically illustrates an Error Correction Code (ECC) encoder, in accordance with an embodiment that is described herein.

FIG. 3 is a block diagram that schematically illustrates an ECC encoder 100, in accordance with an embodiment that is described herein. Encoder 100 is configured to process input data to produce composite code words in accordance with some given composite code. Encoder 100 can be used, for example, to implement ECC encoder 30 in the transmitter of communication system 20, or the encoding functionality of ECC unit 84 of the memory controller in storage system 60, that were described in FIGS. 1 and 2, respectively.

Encoder 100 comprises an interface 104 that receives input data 108 to be encoded. Input data 108 typically comprises multiple data elements, such as binary data elements or bits. Encoder 100 further comprises multiple component encoders 112. Each component encoder 112 encodes its input in accordance with a respective underlying component code of the given composite code, to produce a respective component code word. In the example of FIG. 3, component encoders 112A, 112B and 112C produce respective component code words CW0, CW1 and CW2.

In some embodiments, the component codes comprise BCH codes. Alternatively, the component codes may comprise any other suitable code. A composite code may be regarded as a regular or irregular code in accordance with various regularity aspects. For example, a dv-irregular code refers to herein as a code in which each bit group may be shared among a different number of component codes. As another example, a G-irregular composite code refers to herein as a code in which the size of the shared bit groups varies among the component code words. Other types of irregularity include using the same or different component codes, using the same component codes but with possibly different shortening (i.e., removing excessive encoded bits) for the different component code, and the like.

In some embodiments, the composite encoder comprises a regular code, i.e., the code is regular in every regularity aspect, such as those regularity aspects mentioned above. In other embodiments, the composite encoder may be irregular in one or more regularity aspects.

The input to each of component encoders 112 comprises part of input data 108 and possibly part of one or more code words that were produced by other component encoders. The size of the combined input to a given component encoder equals the size of the respective component code word, excluding the size of the redundancy part that the given component encoder generates.

In the present example, component encoder 112C accepts parts of CW0 and CW1, component encoder 112B accepts part of CW0, and component encoder 112A accepts no inputs from any of the component code words. In some embodiments, the parts of the component coed words that are input to the component encoders comprise groups of bits that are shared among the component code words. An example of a composite code word whose component code words share groups of bits, and may be encoded using composite encoder 100, is described in FIG. 4 below.

Composite encoder 100 comprises a joint encoder 116, which receives CW0, CW1 and CW2 and uses these component code words to jointly produce component code words CW3, CW4 and CW5. Generating CW3 . . . CW5 jointly, based on the individually encoded component code words guaranties that CW3 . . . CW5 are valid code words of the respective underlying component codes.

A combiner 120 receives code words CW0 . . . CW3 from respective component encoders 112A . . . 112C, and CW3 . . . CW5 from joint encoder 116, and combines the component code words to produce a final output composite code word. The combiner outputs only one copy of each group of bits that is shared among two or more component code words. Encoder 100 further comprises control logic 124 that manages the various tasks of composite encoder 100. Among other tasks, control logic 124 schedules the operation of component encoders 112 and joint encoder 116.

The composite encoder configuration in FIG. 3 is given by way of example, and other suitable composite encoder configurations can also be used. For example, although in FIG. 3 component encoders 112 comprise separate encoders, in alternative embodiments the functionality of some or all of the component encoders can be implemented in a single encoding element. Although in FIG. 3 three component code words are encoded individually and three component code words are encoded jointly, in alternative embodiments, any other suitable numbers of component code words may be encoded individually and jointly.

ECC encoder 30 of FIG. 1, ECC unit 84 of FIG. 2 and composite encoder 100 of FIG. 3 may be implemented in software, in hardware, or using a combination of hardware and software elements. In some embodiments, ECC encoder 30, unit 84 and/or composite encoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, ECC encoder 30, unit 84 and/or composite encoder 100 (including interface 104, component encoders 112, joint encoder 116, combiner 120 and control logic 124) are implemented in hardware, such as using one or more Application-Specific Integrated Circuits (ASICs), Field-Programmable Gate Arrays (FPGAs) and/or discrete components. Some or all of the composite encoder functions may alternatively be implemented in software, or using a combination of software and hardware elements.

In the context of the description that follows and in the claims, all the elements of composite encoder 100 that are not part of interface 104 are collectively referred to as encoding circuitry. The encoding circuitry thus comprises at least component encoders 112, joint encoder 116, combiner 120 and control logic 124.

Figure 4:
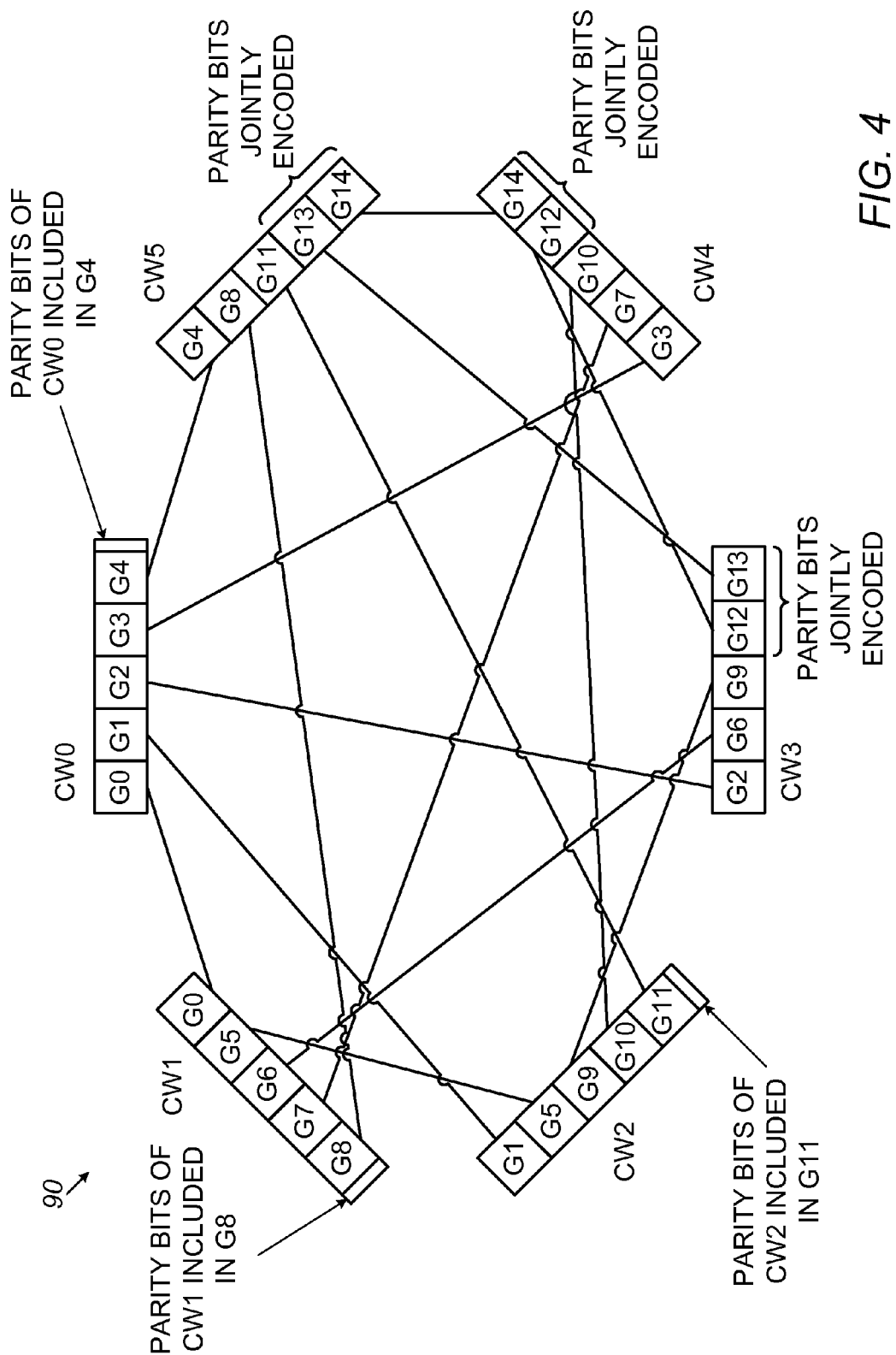
FIG. 4 is a diagram depicting a composite code, in accordance with an embodiment that is described herein.

FIG. 4 is a diagram depicting a composite code 90, in accordance with an embodiment that is described herein. Composite code 90 produces composite code words that each comprises N=6 component code words, which are denoted CW0 . . . CW5. In the present example each of the component code words comprises N−1=5 groups of G bits and the composite code comprises 15 different G-bit groups, which are denoted G0 . . . G14. The sizes of the component and composite codes are thus given by 5·G bits and 15·G bits, respectively. In composite code 90 each G-bit group is shared among dv=2 component code words. For example, G0 is shared between component code words CW0 and CW1, whereas G9 is shared between CW2 and CW3.

Although in the example of FIG. 4 component code 90 comprises six component code words, component code 90 refers in general to embodiments that may comprise any other suitable number N of component codes. Thus, for a composite code 90 that comprises N component code words, there are N(N−1)/2 different combinations of selecting two (dv=2) component code words out of the total N component code words. Therefore, a composite code 90 of size G·N(N−1)/2 bits can be constructed from N(N−1)/2 different groups of G bits, so that each of these G-bit groups is assigned to only one pair of the component code words.

In comparison to the example TBC design described above, in which the 67563 bits of the composite code word are divided among $(N/2)^2=784$ groups, resulting in 86 bits per a G-bit group, in composite code 90 the same number of bits (67563) is divided among 56(56−1)/2=1540 G-bit groups, and therefore the G-bit group size reduces to 67563/1540≈44 bits. By reducing the number of bits that are shared among the component code words in about 50% (44 instead of 86 bits), the likelihood of trapping set events while decoding composite code 90 is much lower than while decoding the TBC code.

Composite code 90 in FIG. 4 comprises G-bit groups that is each shared among two (dv=2) component code words. In alternative embodiments, the G-bit groups may be shared among dv>2 component code words. Table 1 below depicts several design parameters of composite code 90 for dv≥2 and gives explicit expressions for the case dv=2.

TABLE 1

Composite code 90 design parameters

| Parameter | dv = 2 | dv ≥ 2 |
|---|---|---|
| Number of possible selections of dv out of N component code words | $\frac{N(N-1)}{2}$ | $\binom{N}{dv} = \frac{N!}{dv! \cdot (N-dv)!}$ |
| Size of component code word in bits | (N − 1)G | $\binom{N-1}{dv-1}G$ |
| Size of composite code word in bits | $\frac{N(N-1)}{2}G$ | $\binom{N}{dv}G$ |

As noted above, the size of the G-bit groups that are shared among the component code words is a key parameter in reducing the likelihood of trapping set events at the decoder. We now compare between the TBC and composite code 90 designs in terms of the G-bit group size. Consider designing the TBC and composite code 90 with a composite code word size of L bits. The L bits are divided in the TBC design among $(N/dv)^{dv}$ groups and in the composite code 90 design among $$\binom{N}{dv}$$

groups. Let GTBC and GCC denote the G-bit group size in the TBC and composite code 90 designs, respectively. The ratio GTBC/GCC, represents the improvement gain and is given in Equation 1 below, including an approximate evaluation for cases in which dv<<N. Since in practical situations N is much larger than dv, Equation 1 provides a good approximation for all cases of interest.

$$\frac{GTBC}{GCC} = \frac{\binom{N}{dv}}{\left(\frac{N}{dv}\right)^{dv}} \cong \frac{dv^{dv}}{dv!} \qquad \text{Equation 1}$$

Table 2 depicts the gain values given in Equation 1 for several values of dv.

TABLE 2

Improvement gain as a function of dv

| dv | Gain GTBC/GCC |
|---|---|
| 2 | 2 |
| 3 | 4.5 |
| 4 | 10.67 |

In composite code 90 of FIG. 4, CW0 . . . CW5 are encoded in accordance with respective underlying component codes of the composite code. Let R and Rc denote the rates of the composite and component codes, respectively. The relationship between the code rates is given in Equation 2.

$$\frac{1-R}{1-Rc} = dv \qquad \text{Equation 2}$$

In an embodiment, component code words CW3, CW4 and CW5 are encoded jointly to produce the G-bit groups G12, G13 and G14. When performing the joint encoding, G2, G6 and G9 of CW3, G3, G7 and G10 of CW4 and G4, G8 and G11 of CW5 are already available as part of previously encoded component code words CW0 . . . CW3. A method for joint encoding is described in detail below with reference to FIGS. 5A and 5B.

The composite code configuration of FIG. 4 is given by way of example, and in alternative embodiments, any other suitable component code configuration can also be used. For example, although in FIG. 4 each of the component code words has at least one respective bit in common with each of the other component code words, in alternative embodiments, one or more component code words may share bits with only a partial subset of the component code words. In such embodiments, each component code word in at least a subset of the component code words has at least one respective bit in common with each of the other component code words.

As another example, although in FIG. 4 composite code 90 comprises a regular code, in alternative embodiments composite code 90 comprises an irregular code that comprises different component codes of possibly different sizes. In FIG. 4, all the groups of shared bits have the same size of G bits, and each G-bit group is shared among the same number of component code words (i.e., same dv value). In alternative embodiments, different component code words may share a different number of bits, and different groups of shared bits may be shared among a different number of component code words.

As yet another example, although in FIG. 4 the component code word size is an integer multiple of the size G of the groups of shared bits, this condition is not mandatory and may be relaxed in other embodiments. FIG. 4 depicts one possible configuration for sharing bits among the component code words. In alternative embodiments any other suitable bit-sharing schemes may also be used. An example of using permutations of the set of shared bit groups within and among the component code words is described further below.

Joint Encoding of Component Code Words

As noted above, CW3, CW4 and CW5 of composite code 90 are encoded jointly. Methods for joint encoding that are disclosed herein can be used, for example, in implementing joint encoder 116 of composite encoder 100 described above. In some embodiments, the joint encoding is based on previously encoded component code words (e.g., CW0 . . . CW2 in FIG. 4) and on a sub-matrix of a parity check matrix of composite code 90.

Figures 5A, 5B:
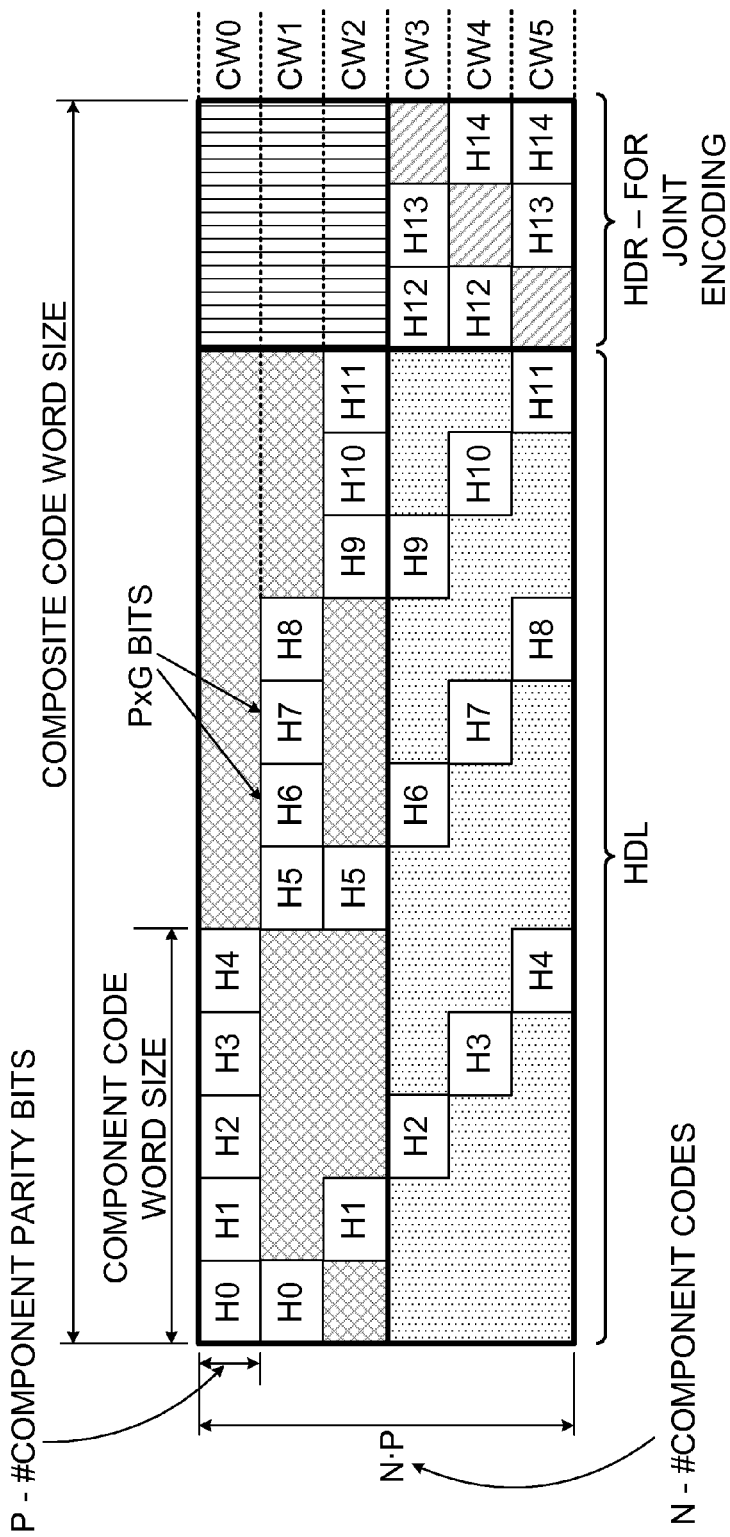
FIGS. 5A and 5B are diagrams of a parity check matrix of a composite code and a respective matrix partitioning, in accordance with an embodiment that is described herein.

FIGS. 5A and 5B are diagrams of a parity check matrix H of composite code 90 and a respective matrix partitioning, in accordance with an embodiment that is described herein. In the present example we assume that each of the underlying component codes generate a number of P redundancy or parity bits. The parity check matrix H in FIG. 5A comprises multiple sub-matrices of P by G bits, which are denoted H0 . . . H14. Areas in H in which no sub-matrix Hi appears are zeroed.

Sub-matrices H0 . . . H4 serve for checking CW0 in accordance with the respective underlying component code. Similarly, H0 and H5 . . . H8 serve for checking CW1, sub-matrices H1, H5 and H9 . . . H11 serve for checking CW2 and so on. Note that each of sub-matrices H0 . . . H14 serves for checking two code words, as implied by the structure of composite code 90 in FIG. 4 above, in which dv=2.

FIG. 5B depicts a certain partitioning of parity check matrix H. The parity check matrix is first partitioned into high (HU) and low (HD) parts, corresponding to CW0 . . . CW2 and CW3 . . . CW5, respectively. The high and low parts are further partitioned into left and right parts resulting in HU=[HUL HUR] and HD=[HDL HDR].

Given a valid composite code word CCW=[CW0 . . . CW5], the composite code word should satisfy the matrix relationship H·[CCW]=[0], and therefore CCW also satisfies the relationship in Equation 3.

$$HD \cdot [CCW] = [0] \qquad \text{Equation 3:}$$

The composite code word CCW can be partitioned into left and right parts of the same widths as HDL and HDR, i.e., CCW=[CCWL CCWR]. Using this partitioning of CCW Equation 3 can be written as:

$$HDL \cdot CCWL + HDR \cdot CCWR = [0] \qquad \text{Equation 4:}$$

In Equation 4, HDL and HDR are predefined in accordance with the structure of composite code 90. Moreover, as will be explained below, HDR comprises a square matrix and is therefore invertible. CCWL comprises the G-bit groups G0 . . . G11 of previously encoded code words CW0 . . . CW2, and CCWR comprises G12, G13 and G14 to be jointly encoded. Consequently, G12 . . . G14 can be encoded using the formula given in Equation 5.

$$[G12\,G13\,G14] = [-HDR^{-1} \cdot HDL] \cdot CCWL = HS \cdot CCWL \qquad \text{Equation 5:}$$

In implementing joint encoder 116, the part of Equation 5 that is related to the code structure, i.e., the matrix HS=−HDR$^{-1}$·HDL, can be calculated and stored beforehand. When composite encoder 100 concludes encoding CW0 . . . CW2, the joint encoder constructs CCWL=[G0 . . . G11] out of CW0 . . . CW2 and derives G12, G13 and G14 using, for example, a multiplication operation by HS, as described in Equation 5 above. In an embodiment, the vector CCWL comprises part of the individually encoded code words. For example, CCWL may exclude the G0 bit group since H0 does not appear in the sub-matrix HDL.

In the disclosed embodiment of the joint encoder, the matrix HDR that is partitioned from the parity check matrix H is invertible and therefore should comprise a square matrix. Let W denote the number of component code words corresponding to the low part matrix HD and therefore also to HDR. W can be found by solving the inequality in Equation 6, to find the minimal integer W that satisfies Equation 6, given P, dv, and G. Solving Equation 6 can be considered an offline operation that is part of preparing the matrix HS, as described above.

$$P \cdot W \leq G \cdot \binom{W}{dv} \qquad \text{Equation 6}$$

The parity check matrix H and respective partitioning configurations of FIGS. 5A and 5B are given by way of example. In alternative embodiments any other suitable parity check matrix and partitioning configurations can also be used. For example, the structure of H depends on the structure of the underlying composite code, and therefore may change when using other variants of the composite code, such as those mentioned regarding component code 90 in FIG. 4 above. As another example, the partitioning of the matrix HDR may differ as a function of the number of parity bits per component code P, the size of the shared group of bits G and dv, as given in Equation 6 above.

Method for Designing Composite Codes

Consider designing a composite code, such as composite code 90 of FIG. 4 above. Assume that the following design parameters are given:

L—The size of the composite code word including redundancy bits.

K—The number of the data bits to be encoded by the composite code.

P—The number of parity bits produced by each of the component codes.

dv—The number of component codes that share a single group of bits.

The design steps are given in the following list:
Determine the rate Rc of the component codes using the equation (1−K/L)/(1−Rc)=dv, wherein K/L is the rate of the composite code.
Determine the size M of the component code words using the relationship Rc=1−P/M.
Select a component code whose output size is M bits, of which P are redundancy bits.
Derive the number N of component codes using the equation L−K>=P·N.
Determine the size G of the shared groups of bits using the relationship $$L \le G \cdot \binom{N}{dv}.$$

Determine the required shortening, as explained below. The shortening step above refers to a situation in which $$G \cdot \binom{N}{dv}$$

is larger than L. Let B denote the number of bits in excess, i.e., $$B = G \cdot \binom{N}{dv} - L.$$

In such a case, the composite encoder is configured to encode an input comprising the K data bits interleaved with B zero bits, using, for example, a predefined interleaving scheme (i.e., resulting in B-bit shortening). When decoding, the decoded excess bits are validated to be zero and discarded.

The composite code design method described above is given by way of example, and other suitable methods for designing component codes can also be used. For example, instead of having L (and thus the rate R) given, L may be derived from another design parameter, such as, for example, a desired Frame Error Rate (FER) for a given Signal to Noise Ratio (SNR).

Figure 6:
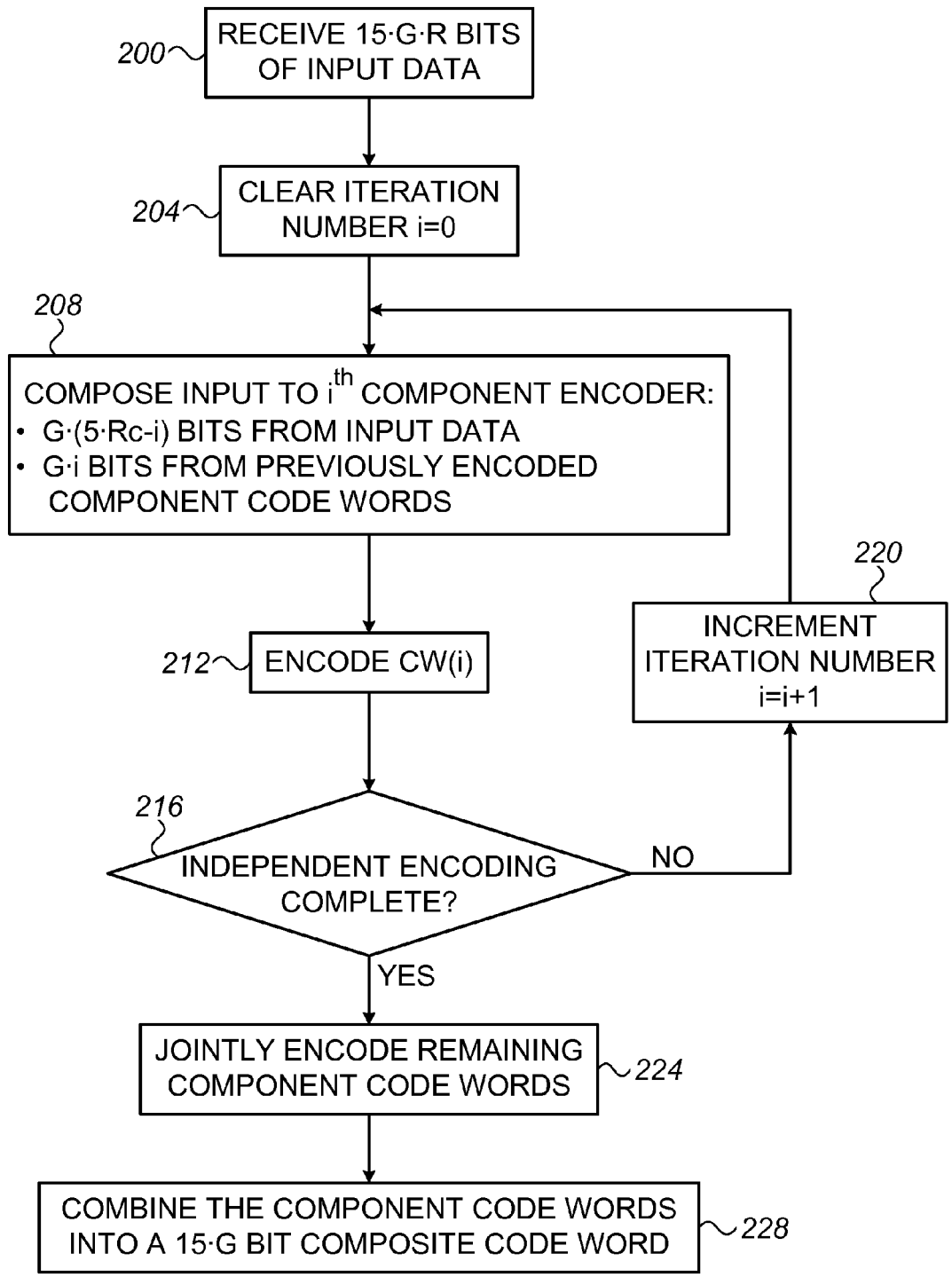
FIG. 6 is a flow chart that schematically illustrates a method for encoding, in accordance with an embodiment that is described herein.

FIG. 6 is a flow chart that schematically illustrates a method for encoding, in accordance with an embodiment that is described herein. The method describes an encoding flow of composite code 90 of FIG. 4 above. The method is described as being executed by composite encoder 100 of FIG. 3 above. As described above in the example of FIG. 4, the size of the composite code is 15·G bits, wherein G denotes the size of the groups G0 ... G14 of composite code 90. As explained above, encoder 100 derives CW0, CW1 and CW2 using individual encoding, and CW3, CW4 and CW5 using joint encoding.

The method begins by encoder 100 receiving 15·G·R bits of data to be encoded, wherein R denotes the code rate of composite code 90, at a reception step 200. As noted above, R is related to the code rate Rc of the underlying component codes by the equation (1−R)=2·(1−Rc), assuming that each group of G bits is shared among dv=2 component code words. At a clearance step 204, encoder 100 sets an iteration counter (denoted i) to zero.

At an input preparation step 208, encoder 100 builds the input to be encoded by the $i^{th}$ component encoder. The input comprises 5·G·Rc bits of which G·(5·Rc−i) bits are taken from the input data, and G·i bits from other component code words. Thus, G0 of CW0 serves for encoding CW1, G1 of CW0 and G5 of CW1 serve for encoding CW2, and G2 of CW0, G6 of CW1 and G9 of CW2 serve for encoding CW3.

At an encoding step 212 the $i^{th}$ component encoder encodes the input that was prepared at step 208 and produces a respective component code word CW(i). At an iteration termination checking step 216, encoder 100 checks whether individual encoding of CW0 CW1 and CW2 is concluded. When the result at step 216 is negative, encoder 100 increments the iteration counter, at an incrementing step 220, and loops back to step 208 to prepare inputs for the next component encoder.

When at step 216 individual encoding is concluded, encoder 100 performs joint encoding to produce CW3 ... CW5 at a joint encoding step 224. Encoder 100 can use any suitable joint encoding method, such as, for example, the joint encoding methods described above with reference to FIGS. 5A and 5B. At a combining step 228, encoder 100 combines the component code words CW0 ... CW5 so that the output composite code word comprises a single copy of each of the G-bit groups G0 ... G14. The method then terminates.

The encoding method of FIG. 6 is given by way of example, and any other suitable encoding method can also be used. Although the method is described in accordance with specific design parameters such as dv=2 and N=6 of composite code 90 of FIG. 4 above, the method is not limited to specific parameter values and is generally applicable to any other suitable design parameters of the composite code.

Increasing the Minimal Distance of the Composite Code

Given an ECC, the minimal (Hamming) distance among the respective code words is related to the error correction capability of the ECC. Typically, increasing the minimal distance, results in better error correction capabilities.

In some embodiments, the composite encoder increases the minimal distance of the composite code by applying bit-ordering permutations to the groups of shared bits. Assume, for example, that a group of G bits is shared among a number (denoted dv) of component code words. In an embodiment, the composite encoder applies a different bit-ordering permutation to each of the dv copies of the G-bit group in the respective component code words. As a result, an error pattern that exceeds the error correction capability of one component code, and that appears as a valid code word of this component code, will appear, with high probability, as an invalid code word of the other component codes sharing this error pattern.

More generally, at least part of the increase in minimal distance can be gained by permuting only some of the copies of the G-bit group in the respective component code words. In other words, in some embodiments only a subset of the dv copies of a given G-bit group have different bit-orders, whereas some of the copies may be identical to one another. Note that permuting a G-bit group differently for multiple component codes in which it participates does not guarantee further increase in the minimal distance. Therefore, in an embodiment, the composite encoder applies bit-order permutation to only one copy of the given G-bit group.

In some embodiments, each of the G-bit groups is shared among two component code words, e.g., as in composite code 90 of FIG. 4 above. In such embodiments, the composite encoder reverses the bit ordering of one of the two copies of each of the G-bit groups. Assume for example that the component codes comprise a BCH code. Applying BCH encoding, e.g., using a generator polynomial g(x), to the G-bit group and to its reversed bit-order version is equivalent to encoding the G-bit group using g(x), and encoding the reversed bit-order version using a generator polynomial $g(x^{-1})$. Assume a polynomial denoted g'(x) that comprises the roots of both the polynomials g(x) and $g(x^{-1})$. Since, the roots of g'(x) comprise the roots of g(x) as well as their reciprocals, the minimal distance of the code generated by g'(x) is at least as large as the minimal distance of the code generated by g(x) or $g(x^{-1})$ alone. Increasing the minimal distance is guaranteed for certain generating polynomials g(x), such as in cases in which the roots of the polynomial form a sequence of consecutive powers of a primitive element α. In alternative embodiments, for example, in embodiments in which dv>2, bit-ordering permutations other than reversing the order of the bits can also be used.

Note that the minimal distance of the composite code can only be as large as the smallest error pattern that in undetectable (e.g., by all component codes which share a group). Thus, when increasing the minimal distances for all the groups, the minimal distance of the composite code is expected to increase as well. Therefore, in order to increase the minimal distance of a given composite code, every group of G-bits should be permuted in at least one of the component codes in which it participates.

Since BCH codes are immune to error bursts of less than P+1 bits (that cannot go undetected), if G<=P, the above mentioned techniques for increasing the minimal distance may be found largely ineffective, referring to error events that occur in a single group. If, however, the bit group size G is larger than the correction capability of a single component code (even if G<=P), these techniques for increasing the minimal distance can achieve a decoding gain by applying methods for correcting a larger number of errors with relatively low complexity.

Using the disclosed above technique to achieve a decoding gain is relevant to error patterns that occur only within a single G-bit group. Using the technique, a given error pattern generates a syndrome that equals the syndrome that would be generated by a code whose generating polynomial equals g'(x). The disclosed embodiments result in error correction and error burst correction capabilities that are higher than those of each of the underlying component codes, and generally in a lower false detect rate for the composite code due to the increased minimal distance.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for Error Correction Code (ECC) encoding, comprising:
receiving, by an ECC encoder in a memory controller, data to be encoded; and
encoding, by the ECC encoder, the data to produce a composite code word of a composite code, wherein the composite code word consists of N component code words, wherein each component code word is encoded in accordance with a respective underlying component code, and wherein at least a given component code word shares bits with all other N−1 component code words of the composite code word.

2. The method according to claim 1, wherein encoding the data comprises individually encoding the component code words in a first subset of the component code words, and generating the component code words in a second subset of the component code words, which comprises the component code words not belonging to the first subset, using joint encoding.

3. The method according to claim 2, wherein individually encoding the component code words in the first subset comprises encoding one or more of the component code words of the first subset based on respective one or more bits that are in common with other component code words of the first subset.

4. The method according to claim 2, wherein generating the second subset of the component code words comprises multiplying a vector comprising at least part of the component code words of the first subset by a predefined matrix.

5. The method according to claim 4, wherein the predefined matrix depends on a sub-matrix of a parity check matrix of the composite code, wherein the sub-matrix serves for checking the component code words of the second subset.

6. The method according to claim 1, wherein encoding the data comprises combining the component code words, so that each bit that is common to one or more component code words appears only once in the composite code word.

7. The method according to claim 1, wherein encoding the data comprises encoding the component code words so that each of the component code words comprises multiple bit groups, each shared by one or more component code words.

8. The method according to claim 7, wherein each of the bit groups comprises a number of bits that depends on a number of the component codes and on a number of the component code words that share each bit group.

9. The method according to claim 1, wherein encoding the data comprises, for a given bit group of the composite code word that is shared among multiple component code words, applying different bit-ordering permutations to the bit group in one or more of the component code words.

10. The method according to claim 9, wherein applying the bit-ordering permutations comprises reversing a bit-order of the bit group in one or more of the component code words.

11. A memory controller, comprising:
a processor configured to store data in a memory; and
encoding circuitry, which is coupled to the processor and is configured to encode the data prior to storage of the data in the memory, so as to produce a composite code word of a composite code, wherein the composite code word consists of N component code words, wherein each component code word is encoded in accordance with a respective underlying component code, and wherein at least a given component code word shares bits with all other N−1 component code words of the composite code word.

12. The memory controller according to claim 11, wherein the encoding circuitry is configured to individually encode the component code words in a first subset of the component code words, and to generate the component code words in a second subset of the component code words, which comprises the component code words not belonging to the first subset, using joint encoding.

13. The memory controller according to claim 12, wherein the encoding circuitry is configured to encode one or more of the component code words of the first subset based on respective one or more bits that are in common with other component code words of the first subset.

14. The memory controller according to claim 12, wherein the encoding circuitry is configured to jointly encode the second subset of the component code words by multiplying a vector comprising at least part of the component code words of the first subset by a predefined matrix.

15. The memory controller according to claim 14 wherein the predefined matrix depends on a sub-matrix of a parity check matrix of the composite code, wherein the sub-matrix serves for checking the component code words of the second subset.

16. The memory controller according to claim 11, wherein the encoding circuitry is configured to combine the component code words, so that each bit that is common to one or more component code words appears only once in the composite code word.

17. The memory controller according to claim 11, wherein the encoding circuitry is configured to encode the component code words so that each of the component code words comprises multiple bit groups, each shared by one or more component code words.

18. The memory controller according to claim 17, wherein each of the bit groups comprises a number of bits that depends on a number of the component codes and on a number of the component code words that share each bit group.

19. The memory controller according to claim 11, wherein, for a given a bit group of the composite code word that is shared among multiple component code words, the encoding circuitry is configured to apply different bit-ordering permutations to the bit group in one or more of the component code words.

20. The memory controller according to claim 19, wherein the encoding circuitry is configured to reverse a bit-order of the bit group in one or more of the component code words.

* * * * *